(12) United States Patent  
Sasaki

(10) Patent No.: US 7,344,968 B2
(45) Date of Patent: Mar. 18, 2008

(54) SEMICONDUCTOR CHIP HAVING PADS WITH PLURAL JUNCTIONS FOR DIFFERENT ASSEMBLY METHODS

(75) Inventor: Masao Sasaki, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 20 days.

(21) Appl. No.: 10/175,860

(22) Filed: Jun. 21, 2002

(65) Prior Publication Data

US 2002/0158346 A1 Oct. 31, 2002

Related U.S. Application Data

(62) Division of application No. 10/041,965, filed on Jan. 9, 2002, now Pat. No. 6,555,923, which is a continuation of application No. 09/137,154, filed on Aug. 20, 1998, now abandoned.

(30) Foreign Application Priority Data

Sep. 11, 1997 (JP) ............................................. 9-246535

(51) Int. Cl.
*H01L 21/44* (2006.01)
*H01L 21/50* (2006.01)
*H01L 23/48* (2006.01)

(52) U.S. Cl. ........................ 438/611; 438/123; 257/736
(58) Field of Classification Search ......... 438/611–617, 438/123; 257/734–739, 673, 676, 700
See application file for complete search history.

(56) References Cited

U.S. PATENT DOCUMENTS

| | | | |
|---|---|---|---|
| 4,934,820 A | 6/1990 | Takahashi et al. | |
| 4,990,996 A | 2/1991 | Kumar et al. | |
| 5,287,000 A | 2/1994 | Takahashi et al. | |
| 5,291,374 A | 3/1994 | Hirata et al. | |
| 5,442,241 A | 8/1995 | Tane | |
| 5,506,499 A | 4/1996 | Puar | |
| 5,517,127 A | 5/1996 | Bergeron et al. | |
| 5,554,940 A | 9/1996 | Hubacher | |
| 5,767,564 A | 6/1998 | Kunimatsu et al. | |
| 5,844,317 A | 12/1998 | Bertolet et al. | |
| 5,854,513 A | 12/1998 | Kim | |
| 5,891,745 A | 4/1999 | Dunaway et al. | |
| 5,962,919 A | 10/1999 | Liang et al. | |
| 5,977,641 A | 11/1999 | Takahashi et al. | |
| 5,994,773 A | 11/1999 | Hirakawa | |
| 6,008,061 A | 12/1999 | Kasai | |
| 6,008,542 A | 12/1999 | Takamori | |
| 6,025,258 A | 2/2000 | Ochiai et al. | |
| 6,043,563 A | 3/2000 | Eldridge et al. | |
| 6,084,300 A | 7/2000 | Oka | |
| 6,084,312 A | 7/2000 | Lee | |
| 6,429,113 B1 * | 8/2002 | Lewis et al. ................. 438/612 |
| 6,445,001 B2 | 9/2002 | Yoshida | |
| 6,525,422 B1 * | 2/2003 | Ono et al. ................... 257/737 |

FOREIGN PATENT DOCUMENTS

| | | |
|---|---|---|
| JP | 04-005841 | 1/1992 |
| JP | 4-51153 | 4/1992 |
| JP | 07-221135 | 8/1995 |
| JP | 08-316397 | 11/1996 |
| JP | 9-326465 | 12/1997 |
| JP | 11-087400 | 3/1999 |

* cited by examiner

*Primary Examiner*—Calvin Lee
(74) *Attorney, Agent, or Firm*—Volentine & Whitt, P.L.L.C.

(57) ABSTRACT

Development efficiency and mass production efficiency of a semiconductor chip (LSI) is improved, whereby the LSI on which an integrated circuit is formed has plural pad parts connecting the integrated circuit with an external circuit. The pad part is provided with a first junction consisting of a window formed in the protective film and the pad exposed from the window, and a second junction consisting of a window formed in the protective film and a bump deposited on the pad exposed from the window. When it is required that the LSI is to be connected with an external circuit by wire bonding, the first junction is connected with the external circuit using a wire. When it is required to connect the LSI with an external circuit by the TAB method or the COG method, the second junction is directly connected to the external circuit.

15 Claims, 6 Drawing Sheets

SEMICONDUCTOR CHIP HAVING PADS WITH PLURAL JUNCTIONS FOR DIFFERENT ASSEMBLY METHODS

This is a divisional application of application Ser. No. 10/041,965, filed Jan. 9, 2002, now U.S. Pat. No. 6,555,923, which is a continuation application of application Ser. No. 09/137,154, filed Aug. 20, 1998, now abandoned, which are hereby incorporated by reference in their entirety for all purposes.

BACKGROUND OF THE INVENTION

1. Field of the Invention

The present invention relates to a semiconductor chip (hereinafter, called LSI) with a pad part connected between an integrated circuit and an external circuit so as to output/input a signal to/from the integrated circuit.

2. Description of the Related Art

FIGS. 8(a) through 8(c) are plan views showing a conventional LSI. FIG. 8(a) is a view showing a layout of pads in the LSI, FIG. 8(b) is an enlarged view of a part indicated by "A" in FIG. 8(a), and FIG. 8(c) is a view showing a connection condition in FIG. 8(a).

In this LSI 10, an integrated circuit not shown is formed on a substrate, and a plurality of wiring patterns are formed to input/output a signal from/to the integrated circuit. Plural pads 11 to be terminals are formed in the plural wiring patterns. The surface of the LSI 10 is covered by a protective film 12. The protective film 12 is partially removed at parts corresponding to the plural pads 11 so as to form windows 13. Plural pad parts 14 are formed in a manner that each pad part 14 consists of the window 13 and the pad 11 exposed from the window 13.

These pad parts 14 are used for wire bonding. As shown in FIG. 8(c), the pad 11 exposes from the window 13 in the pad part 14 is connected with an external circuit through a wire 15, whereby the external circuit and the LSI are assembled.

FIGS. 9(a) through 9(c) are plan views showing another conventional LSI. FIG. 9 (a) is a view showing a layout of pads in the LSI, FIG. 9(b) is an enlarged view of a part indicated by B in FIG. 9(a), and FIG. 9(c) is a view showing a connection condition in FIG. 9(a).

In this LSI 20, an integrated circuit such as the same integrated circuit in the LSI 1 is formed on a substrate, and a plurality of wiring patterns are formed. Plural pads 11 to be terminals are formed in the plural wiring patterns similarly to the LSI 10. The surface of the LSI 20 is covered by a protective film 21. The protective film 21 is partially removed at parts corresponding to the plural pads 11 so as to form windows 23 as shown in FIG. 9(b). A bump 22 of material such as solder is deposited on the pad exposed from the window 23, and the pad 11 further projects from the surface of the protective film 21. A pad part 25 consists of the window 23 and the bump 22.

As shown in FIG. 9(c), the LSI 20 is directly connected to an external circuit 26 with the bump 22 of the pad part 25, whereby assembly is executed by the TAB (Tape Automated Bonding) method or the COG (Chip On Glass) method.

However, the conventional LSIs have the following problems. Each LSI 10, 20 has only one connection method connecting to an external circuit in accordance with each structure of the pad part 14, 25. Thus, though the integrated circuit and the wiring pattern of the LSI 10 are similar to those of the LSI 20 and the LSI 10 operates similarly to the LSI 20, it is possible to use only one assembly method based on each structure of the pad part 14, 25. As a result, it is necessary to separately manufacture the LSI 10 which is connected to the external circuit by wire bonding and the LSI 20 which is connected to the external circuit by the TAB method, therefore, it is impossible to improve development efficiency and mass production effect.

SUMMARY OF THE INVENTION

To solve the above described problems, the first aspect of the present invention is a semiconductor device comprising (a) a substrate on which an integrated circuit and a plurality of terminals inputting/outputting a signal to/from the integrated circuit are formed, (b) a film covering a surface of the substrate over the terminals, said film having a plurality of groups of at least two apertures, each of said groups formed at a position corresponding to each of the terminals, and (c) a plurality of pad parts connecting with an external circuit, each of said pad parts including at least a first junction being exposed through one aperture so as to be connected with the external circuit via a wire and a second junction provided with conductive material and projecting from another aperture so as to be connected with the external circuit via the conductive material.

In the second aspect of the present invention, the first junction and the second junction may be selectively connected to the external circuit.

The third aspect is a semiconductor chip comprising, (a) a substrate on which an integrated circuit and a plurality of terminals inputting/outputting a signal to/from the integrated circuit are formed, (b) a film covering a surface of the substrate over the terminals, said film having a plurality of groups of at least two apertures, each of said groups formed at a position corresponding to each of the terminals, and (c) a plurality of pad parts connecting with an external circuit, each of said pad parts including at least a first junction structured by exposing the terminal from one aperture and a second junction structured by adding conductive material so as to project from another aperture.

In the fourth aspect, the second junction may be arranged near a center of the substrate rather than the first junction.

In the fifth aspect, at least one of said pad part may include a plurality of the first junctions.

In the sixth aspect, at least one of said pad parts includes a plurality of the second junctions.

According to the first through sixth aspects, in the first junction of each pad part, the terminal exposed from the aperture is connected to a wire by wire bonding, whereby the integrated circuit in the semiconductor chip and the external circuit are connected. In the second junction, the conductive material deposited on the terminal so as to project from the aperture is directly connected to the external circuit and a device by the TAB method and the COG method, whereby the external circuit and the integrated circuit in the LSI are connected. As a result, it is possible to select an assembly method among plural methods without changing the structure of the LSI. Accordingly, the above described problem can be solved.

According to the present invention, each pad part connecting each terminal in the LSI and the external circuit is provided with the first junction connected to the external circuit by wire bonding and the second junction formed by depositing conductive material that is directly connected to the external circuit. As a result, it is possible to select a method among plural assembly methods, and it is possible to assemble LSI on demand without changing the LSI. Thus, it is possible to improve development efficiency and mass production efficiency for the LSI.

Moreover, the plural pads parts are arranged so as to have the first junction at the outside and so as to have the second junction at the center side. As a result, in addition to the above mentioned effects, it is possible to use an assembly method such as wire bonding and an assembly method such as the TAB method and the COG method at the same time. Further, a device can be mounted on the LSI while the LSI is connected to the external circuit by wire bonding, so that it is possible to miniaturize a system to which the LSI is fabricated.

Further, pad parts are provided with a plurality of the first junctions or the second junctions, thus it is possible to increase the number of available assembly methods.

BRIEF DESCRIPTION OF THE DRAWINGS

Other objects and advantages of the present invention will become apparent during the following discussion in conjunction with the accompanying drawings in which.

DETAILED DESCRIPTION OF THE PREFERRED EMBODIMENTS

Hereinafter, concrete explanations will be given of embodiments of the present invention with reference to drawings.
[First Embodiment]

Figure 1A:
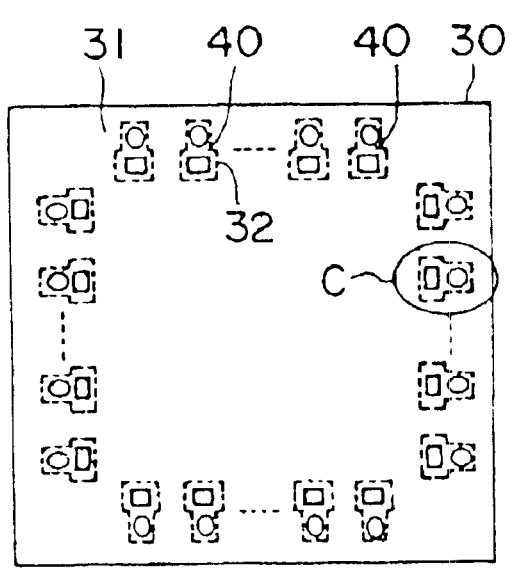
FIGS. 1(a) and 1(b) are plan views showing an LSI according to an first embodiment of the present invention.
Figure 1B:
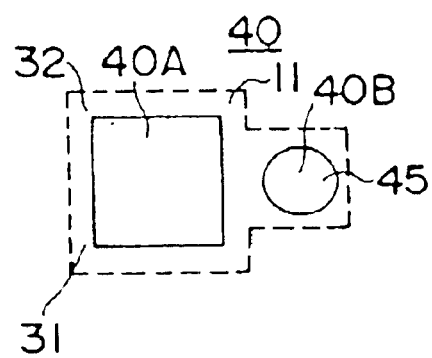

FIGS. 1(a) and 1(b) are plan views showing an LSI according to the first embodiment of the present invention. FIG. 1(a) is view showing a layout of pad parts, and FIG. 1(b) is an enlarged view showing a "C" part in FIG. 1(a).

The LSI 30 is provided with a not shown integrated circuit formed on a rectangular substrate and plural wiring patterns formed with the aluminum and connected to the integrated circuit. The surface of the LSI 30 is covered by a protective film 31. In the wiring patterns, plural pads 32 to be terminals are formed, and a pad part 40 inputting/outputting a signal to/from the external circuit is formed at each position of the pad 32.

Figure 2:
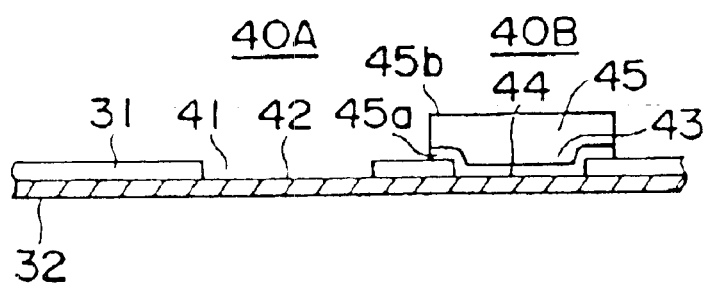
FIG. 2 is a sectional view showing a pad part 40 in FIG. 1.

FIG. 2 is a sectional view showing a structure of the pad part 40 in FIG. 1. The pad part 40 is provided with a first junction 40A and a second junction 40B arranged on a common pad 32.

The first junction 40A consists of a first window 41 from which the protective film 31 is removed, and a part 42 exposed from the window 41 in the pad 32.

The second junction 40B consists of a second window 43 from which the protective film 31 is removed, a part 44 exposed from the window 43 in the pad 32, and a bump 45 of conductive material deposited on the part 44. The bump 45 is formed by depositing a lower layer 45a such as copper and a connection layer 45b such as gold and solder on the pad 32 so as to project from the protective film 31.

In this LSI 30, the plural pad parts 40 are arranged so as to be the first junction 40A at the center side of the substrate and so as to be the second junction 40B at outside of the substrate.

Figure 3A:
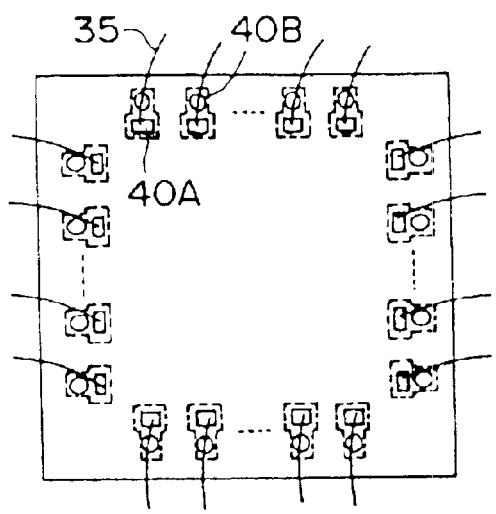
FIGS. 3(a) and 3(c) are plan views showing connection samples in FIG. 1, and FIGS. 3(b) and 3(d) are sectional views showing the connection samples of FIGS. 3(a) and 3(c)
Figure 3C:
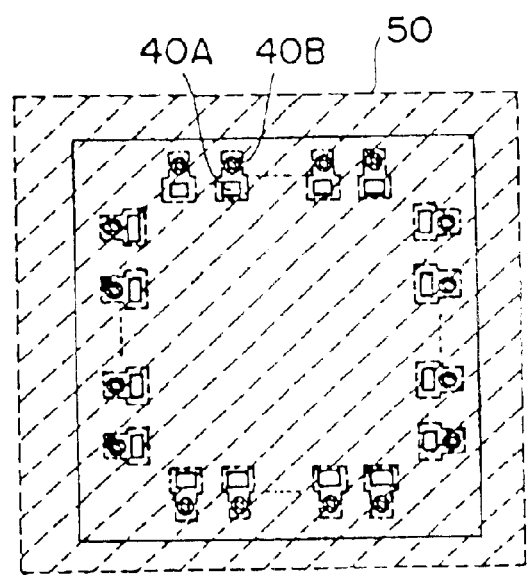
Figure 3B:
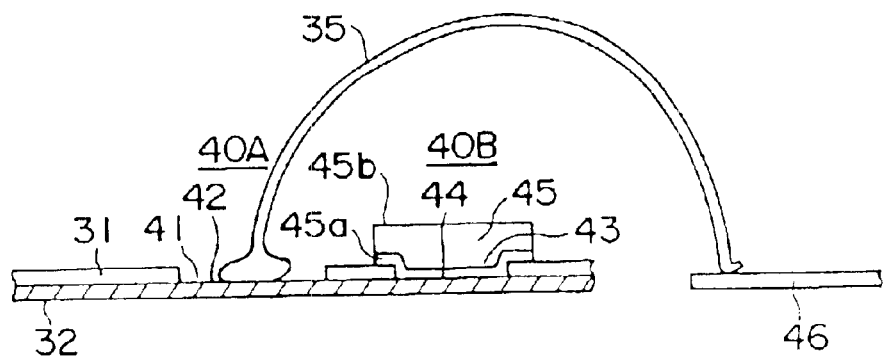
Figure 3D:
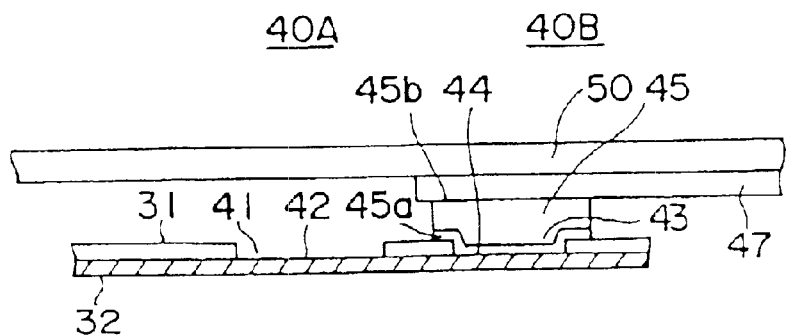

FIGS. 3(a) and 3(c) are plan views showing connection samples, and FIGS. 3(b) and 3(d) are sectional views of FIGS. 3(a) and 3(c). With reference to FIGS. 3(a) through 3(d), explanations will be given of how to use the LSI 30.

In the pad part 40 of the LSI 30, the junction 40A has a structure suitable to an assembly method such as the wire bonding, and the junction 40B has a structure suitable to an assembly method such as the TAB method and COG method. Thus, when it is required that the LSI 30 is connected to an electrode of an external circuit by wire bonding, as shown in FIGS. 3(a) and 3(b), the junction 40A of each pad part 40 is connected with an electrode 46 of an external circuit through a wire 35 such as Al and Au. When it is required that the LSI 30 is connected to an external circuit by the TAB method and the COG method, as shown in FIGS. 3(c) and 3(d), the connection layer 45b in the junction 40B is directly connected to an electrode 47 of an external circuit formed on a tape or a glass 50.

As above described, according to the first embodiment, two junctions 40A and 40B connecting with the external circuit are arranged on the common pad 32 for each pad part 40A. The junction 40A is structured so as to be connectable with the external circuit by wire bonding, and the junction 40B is structured so as to be connectable with the external circuit by the TAB method and the COG method. Therefore, plural assembly methods are available to the LSI 30. As a result, though no change is given to the pad part 40 of the LSI 30, plural assembly methods are available only by selecting an assembly method on demand after completing the LSI 30. Therefore, it is possible for the LSI 30 to improve development efficiency and mass production efficiency.
[Second Embodiment]

Figure 4:
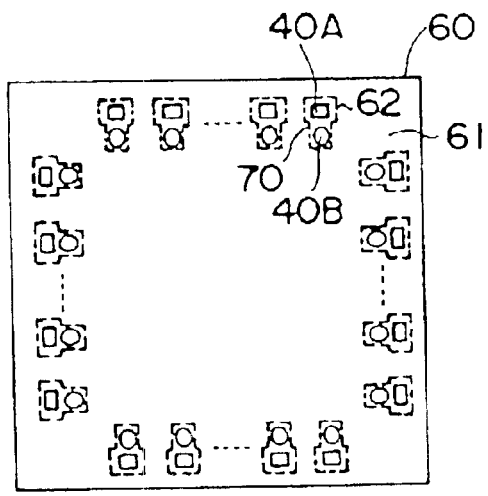
FIG. 4 is a plan view showing an LSI according to a second embodiment of the present invention.

FIG. 4 is a plan view showing an LSI according to the second embodiment of the present invention.

The LSI 60 is provided with a not shown integrated circuit formed on a rectangular substrate and plural wiring patterns formed with the aluminum and connected to the integrated circuit. The surface of the LSI 60 is covered with a protective film 61. In the wiring patterns, plural pads 62 to be terminals are formed, and a pad part 70 inputting/outputting a signal to/from the external circuit is formed at each position of the pad 62.

Each pad part 70 is provided with a first junction 40A and a second junction 40B similarly to those in FIG. 4. However, in this LSI 60, plural pad parts 70 are arranged so as to position the junction 40A at the outside of the substrate and so as to position the junction 40B at the center side of the substrate.

Figure 5A:
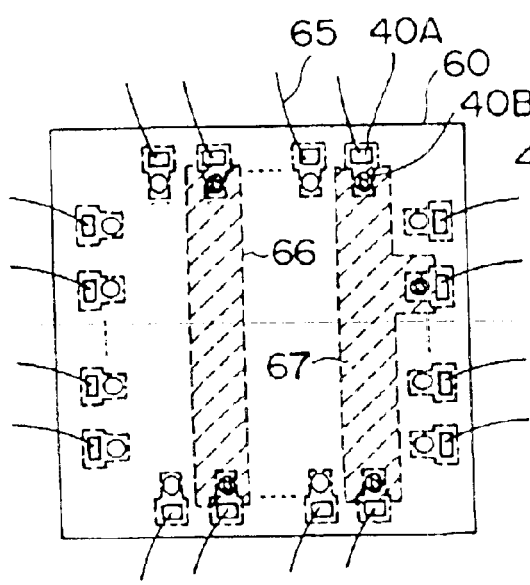
FIGS. 5(a) and 5(b) are plan views showing connection samples in FIG. 4.
Figure 5B:
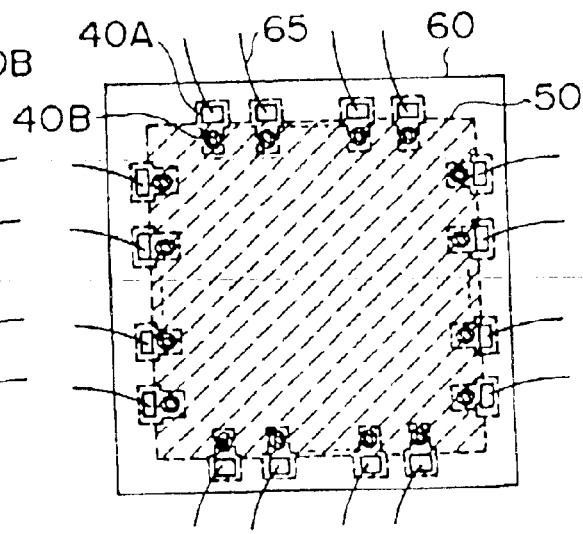

FIGS. 5(a) and 5(b) are plan views showing connection samples. With reference to FIGS. 5(a) and 5(b), explanations will be given of how to use the LSI 60.

In the pad part 70 of the LSI 60, the junction 40A has a structure suitable to assembly using wire bonding, and the junction 40B has a structure suitable to assembly of the TAB method and COG method. Thus, when it is required that the LSI 60 is connected to an external circuit by wiring bonding, as shown in FIG. 5(*a*), devices 66, 67 such as chip capacitors are mounted so as to connect with the junction 40B at the center side on demand of each pad part 70.

When it is required that the LSI 60 is connected to an external circuit by the TAB method and the COG method, the connection layer 45*b* in the junction 40B is directly connected to external circuit formed on a tape or a glass 50. In addition, when it is required that the LSI 60 is connected to an external circuit by wire bonding, as shown in FIG. 5(*b*), each junction 40A at the outside is connected to the external circuit through a wire 65.

As above described, according to the LSI 60 of the second embodiment, two junctions 40A and 40B are arranged for each pad part 70. The junction 40A is arranged at the outside of the substrate and the junction 40B is arranged at the center side of the substrate. Thus, as same as the first embodiment, it is possible for the LSI 60 to connect with an external circuit by wire bonding and it is also possible to connect with an external circuit by the TAB method and the COG method.

Therefore, plural assembly methods are available to the LSI 60. Further, plural assembly methods are available at the same time, so that is possible to improve development efficiency and mass production efficiency of the LSI 60. Moreover, it is possible to mount the devices 66, 67 on the LSI 60 while the LSI 60 is assembled by wire bonding, though the devices 66, 67 are conventionally arranged on a peripheral circuit of the LSI 60. As a result, it is possible to miniaturize a system including the LSI 60.

[Third Embodiment]

Figure 6:
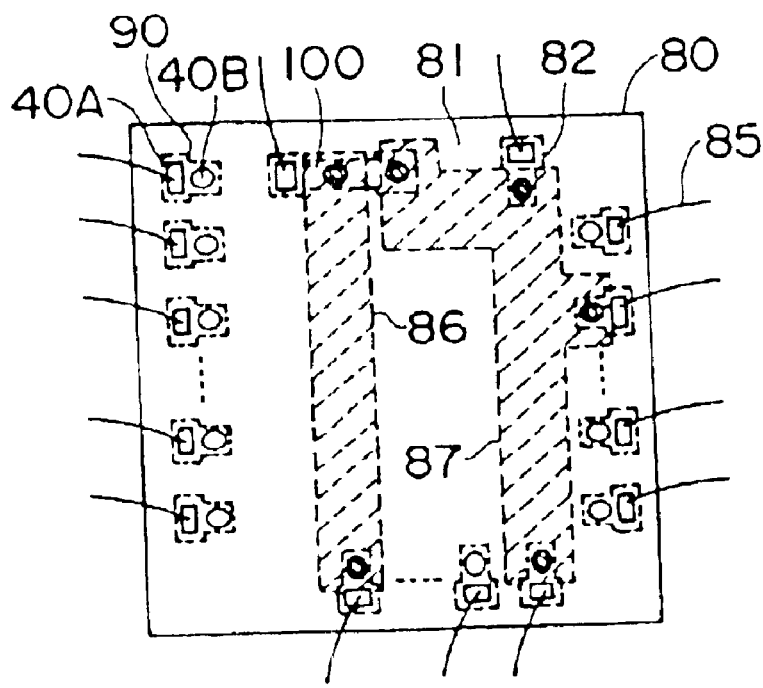
FIG. 6 is a plan view showing an LSI according to a third embodiment of the present invention.

FIG. 6 is a plan view showing an LSI according to the third embodiment of the present invention.

The LSI 80 is provided with a not shown integrated circuit formed on a rectangular substrate and plural wiring patterns formed with the aluminum and connected to the integrated circuit. The surface of the LSI 80 is covered with a protective film 81. In the wiring patterns, plural pads 82 to be terminals are formed, and two kinds of pad parts 90,100 inputting/outputting a signal to/from the external circuit are properly formed at each position of the pad 82.

Figure 7:
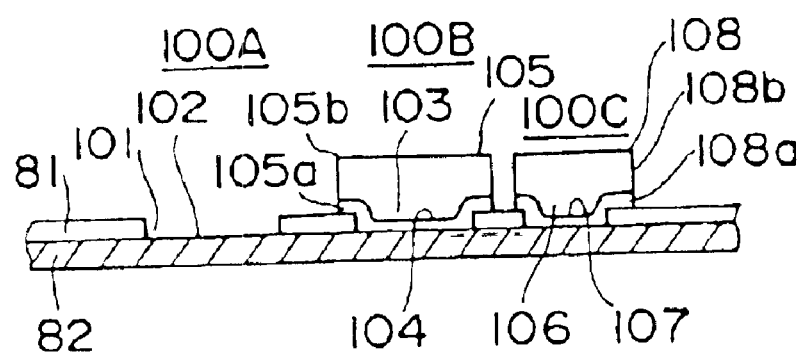
FIG. 7 is a sectional view showing a pad part 100 in FIG. 6.
Figure 8A:
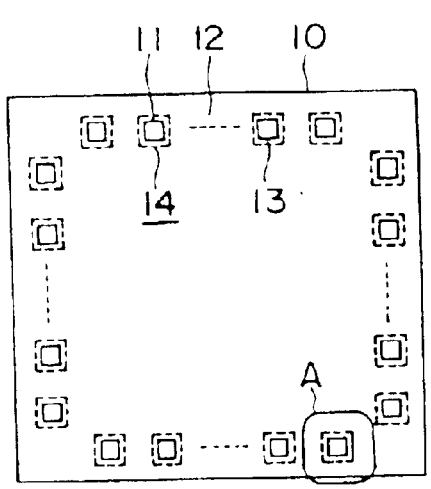
FIGS. 8(a), 8(b) and 8(c) are plan views showing a conventional LSI.
Figure 8C:
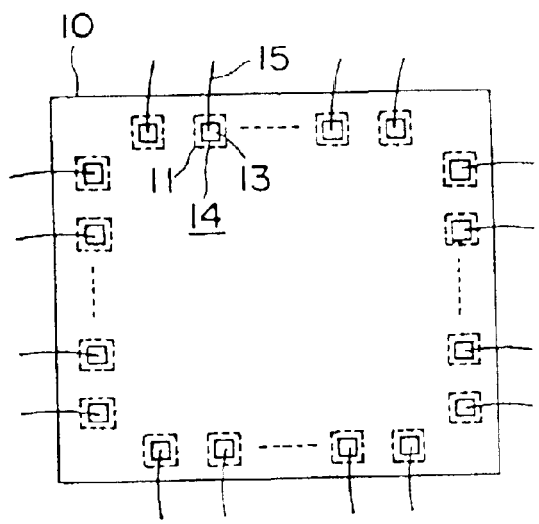
Figure 8B:
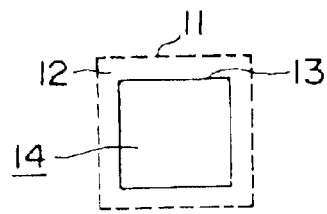
Figure 9A:
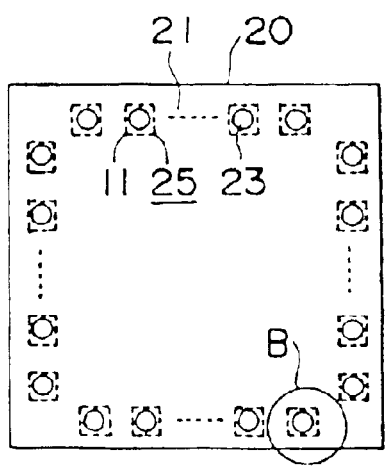
FIGS. 9(a), 9(b) and 9(c) are plan views showing another conventional LSI.
Figure 9C:
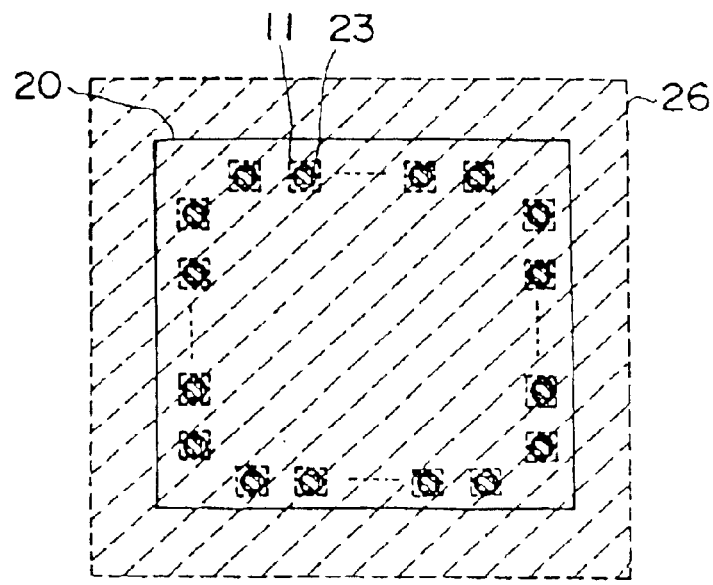
Figure 9B:
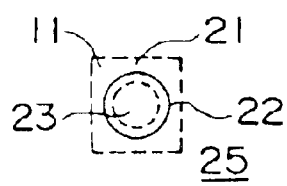

FIG. 7 is a sectional view showing a structure of the pad part 100 in FIG. 6.

The pad part 90 is provided with a first junction 40A and a second junction 40B similar to those in FIG. 4. The pad part 100, as shown in FIG. 7, is provided with a first junction 100 A and two second junctions 100B, 100*c* arranged on the common pad 82.

The first junction 100A consists of a first window 101 from which the protective film 81 is removed, and a part 102 exposed from the window 101 in the pad 82.

The second junction 100B consists of a second window 103 from which the protective film 81 is removed, a part 104 exposed from the window 103 in the pad 82, and a bump 105 of conductive material deposited on the part 104. The bump 105 is formed by depositing a lower layer 105*a* such as a copper and a connection layer 105*b* such as gold and solder on the pad 82 so as to project from the protective film 81.

The third junction 100C consists of a third window 106 from which the protective film 81 is removed, a part 107 exposing from the window 106 in the pad 82, and a bump 108 of conductive material deposited on the part 107. The bump 108 is formed by depositing a lower layer 108*a* such as copper and a connection layer 108*b* such as gold and solder on the pad 82 so as to project from the protective film 81.

Next, explanations will be given of how to use the LSI 80.

In each pad part 90, 100 of the LSI 80, each junction 40A, 100A has a structure suitable to an assembly method such as wire bonding, and each junction 40B, 100B, 100C has a structure suitable to an assembly method such as the TAB method and COG method. Thus, when it is required that the LSI 80 is connected to an external circuit by wire bonding, each junction 40A, 100A of each pad part 90, 100 is connected to an external circuit via a wire 85. Further, devices 86, 87 such as chip capacitors are mounted on the selected junctions 40B, 100B, 100C so as to be connected on demand. Since the pad part 100 is provided with the junctions 100B, 100C, it is possible for the pad part 100 to connect with two devices 86, 87.

When it is required that the LSI 80 is connected to an external circuit by the TAB method and the COG method, each connection layer 45*b*, 105 *b*, 108*b* in the junction 40B, 100B, 100C is directly connected to the external circuit formed on a tape or a glass. In addition, when it is required that the LSI 80 is connected to an external circuit by wire bonding, as shown in FIG. 6, each junction 40A at the outside is connected to the external circuit through a wire 85.

As above described, according to LSI 80 of the third embodiment, two junctions 40A, 40B and three junctions 100A, 100B, 100C are arranged for each pad part 90, 100. Thus, as same as the first embodiment, it is possible for the LSI 80 to connect with an external circuit by wire bonding and it is also possible to connect with an external circuit by the TAB method and COG method. Therefore, plural assembly methods are available to the LSI 80. Further, plural assembly methods are available at the same time, so that is possible to improve development efficiency and mass production efficiency of the LSI 80. Moreover, it is possible to mount the devices 86, 87 on the LSI 80 while the LSI 80 is assembled by wire bonding, and it is possible to mount two devices 86, 87 on one pad part 100. As a result, it is possible to increase variation of assembly methods further than the second embodiment and it is possible to miniaturize a system including the LSI 80.

The present invention is not limited to the above embodiments, and various modifications are available. For example, the pad part 100 is provided with two junctions 100B, 100C suitable to the TAB method and the COG method, however, the number of junctions is not limited to two, three or more junctions may be arranged. The pad part 100 may be also provided with plural junctions 100A suitable to wire bonding. With this arrangement, it is possible to reduce wiring in peripheral circuits, so that it is possible to miniaturize a system.

This invention being thus described, it will be obvious that same may be varied in various ways. Such variations are not to be regarded as departure from the spirit and scope of the invention, and all such modifications would be obvious for one skilled in the art intended to be included within the scope of the following claims.

What is claimed is:

1. A method of manufacturing a semiconductor device comprising:
    providing a semiconductor chip which includes a semiconductor substrate, a conductive pattern on the semiconductor substrate, a protective film that covers the semiconductor substrate and the conductive pattern, and a first opening in the protective film that exposes a first portion of the, conductive pattern, and a second opening in the protective film that exposes a second portion of the conductive pattern;
    mounting a device on the protective film so as to be electrically connected to the first portion of the conductive pattern by a bump through the first opening; and electrically connecting an external device to the second portion of the conductive pattern by a wire through the second opening.

2. The method of manufacturing a semiconductor device of claim 1, wherein the second opening is nearer to a peripheral edge of the semiconductor device than the first opening.

3. The method of manufacturing a semiconductor device of claim 1, wherein said mounting a device comprises forming the bump in the first opening.

4. The method of manufacturing a semiconductor device of claim 1, wherein the device is a capacitor.

5. The method of manufacturing a semiconductor device of claim 1, wherein said providing further comprises providing a third opening in the protective film that exposes a third portion of the conductive pattern, the method further comprising:

mounting a second device on the protective film so as to be electrically connected to the third portion of the conductive pattern by a second bump through the third opening, wherein the second opening and the third opening are provided to a single one of the first opening.

6. A method of manufacturing a semiconductor device comprising:

providing a semiconductor chip which includes a semiconductor substrate, an integrated circuit on the semiconductor substrate, a protective film that covers the semiconductor substrate and the integrated circuit, and an opening group in the protective film, the opening group including a first opening that exposes a first pad of the integrated circuit and a second opening that exposes a second pad of the integrated circuit, whereby the first and second pads are electrically connected to each other;

mounting a device on the protective film so as to be electrically connected to the first pad of the opening group through the first opening by a bump; and electrically connecting an external device to the second pad of the opening group through the second opening by a wire.

7. The method of manufacturing a semiconductor device of claim 6, wherein the second opening of the opening group is nearer to a peripheral edge of the semiconductor device than the first opening of the opening group.

8. The method of manufacturing a semiconductor device of claim 6, wherein said mounting a device comprises forming the bump in the first opening.

9. The method of manufacturing a semiconductor device of claim 6, wherein the first pad and the second pad of the opening group are formed in a common conductive layer.

10. The method of manufacturing a semiconductor device of claim 6, wherein the semiconductor chip further includes a plurality of additional opening group, each of the plurality of additional opening groups having a respective first opening that exposes a respective first pad of the integrated circuit and a respective second opening that exposes a respective second pad of the integrated circuit.

11. The method of manufacturing a semiconductor device of claim 6, wherein said mounting a device occurs after said electrically connecting an external circuit.

12. The method of manufacturing a semiconductor device of claim 6, wherein the device is a capacitor.

13. A method of manufacturing a semiconductor device comprising:

providing a semiconductor chip which includes a semiconductor substrate, a conductive pattern on the semiconductor substrate, a protective film that covers the semiconductor substrate and the conductive pattern, plural first opening in the protective film that respective film that exposes a second portion of the conductive pattern;

electrically connecting an external device to the second portion of the conductive pattern by a wire through the second opening; and providing respective conductive bumps on the first portions of the conductive pattern in the first openings.

14. The method of manufacturing a semiconductor device of claim 13, further comprising:

mounting a first device on the protective film so as to be electrically connected to one of the first portions of the conductive pattern by a corresponding one of the respective conductive bumps; and mounting a second device on the protective film so as to be electrically connected to another of the first portions of the conductive parttern by a corresponding another of the respective conductive bumps.

15. The method of manufacturing a semiconductor device of claim 14, wherein said mounting a first device and said mounting a second device comprise mounting capacitors.

* * * * *